(12) United States Patent
Wu et al.

(10) Patent No.: US 11,469,854 B2
(45) Date of Patent: Oct. 11, 2022

(54) MULTI-LEVEL CHANNEL CODING FOR WIRELESS COMMUNICATIONS

(71) Applicant: QUALCOMM Incorporated, San Diego, CA (US)

(72) Inventors: Shuanshuan Wu, San Diego, CA (US); Assaf Touboul, Netanya (IL); Shailesh Patil, San Diego, CA (US); Shay Landis, Hod Hasharon (IL); Kapil Gulati, Belle Mead, NJ (US); Michael Levitsky, Rehovot (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/219,241

(22) Filed: Mar. 31, 2021

(65) Prior Publication Data

US 2021/0314089 A1 Oct. 7, 2021

Related U.S. Application Data

(60) Provisional application No. 63/005,664, filed on Apr. 6, 2020.

(51) Int. Cl.
| | |
|---|---|
| *H03M 13/00* | (2006.01) |
| *H04L 1/00* | (2006.01) |
| *H03M 13/31* | (2006.01) |
| *H03M 13/11* | (2006.01) |
| *H03M 13/25* | (2006.01) |
| *H03M 13/09* | (2006.01) |

(52) U.S. Cl.
CPC .......... *H04L 1/0061* (2013.01); *H03M 13/09* (2013.01); *H03M 13/11* (2013.01); *H03M 13/251* (2013.01); *H03M 13/31* (2013.01); *H04L 1/0041* (2013.01); *H04L 1/0045* (2013.01)

(58) Field of Classification Search
None
See application file for complete search history.

(56) References Cited

U.S. PATENT DOCUMENTS

| | | | | |
|---|---|---|---|---|
| 5,966,412 | A * | 10/1999 | Ramaswamy | ...... H04L 27/3488 375/261 |
| 9,667,459 | B1 * | 5/2017 | Naim | ...................... H04L 69/02 |
| 10,181,973 | B2 * | 1/2019 | Liu | ........................ H03M 13/23 |
| 2011/0044398 | A1 * | 2/2011 | Dowling | ............. H04L 27/3433 375/340 |
| 2011/0135029 | A1 * | 6/2011 | Jianming | ............ H04L 27/3411 375/286 |

* cited by examiner

*Primary Examiner* — Mujtaba M Chaudry
(74) *Attorney, Agent, or Firm* — Harrity & Harrity, LLP

(57) ABSTRACT

Various aspects of the present disclosure generally relate to wireless communication. In some aspects, a transmitter device may segment a plurality of bits of a communication into a first set of bits and a second set of bits; process the first set of bits using a first processing chain and the second set of bits using a second processing chain, wherein the first set of bits is mapped to most significant bits (MSBs) of one or more symbols of a composite constellation and the second set of bits is mapped to least significant bits (LSBs) of the one or more symbols of the composite constellation, and wherein the composite constellation is formed from a plurality of lower order constellations; modulate the first set of bits and the second set of bits to generate a set of modulated symbols; and transmit the set of modulated symbols. Numerous other aspects are provided.

29 Claims, 9 Drawing Sheets

MULTI-LEVEL CHANNEL CODING FOR WIRELESS COMMUNICATIONS

CROSS-REFERENCE TO RELATED APPLICATION

This Patent Application claims priority to U.S. Provisional Patent Application No. 63/005,664, filed on Apr. 6, 2020, entitled "MULTI-LEVEL CHANNEL CODING FOR WIRELESS COMMUNICATIONS," and assigned to the assignee hereof. The disclosure of the prior Application is considered part of and is incorporated by reference into this Patent Application.

FIELD OF THE DISCLOSURE

Aspects of the present disclosure generally relate to wireless communication and to techniques and apparatuses for multi-level channel coding for wireless communications.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include a number of base stations (BSs) that can support communication for a number of user equipment (UEs). A UE may communicate with a BS via the downlink and uplink. "Downlink" (or "forward link") refers to the communication link from the BS to the UE, and "uplink" (or "reverse link") refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, or the like.

The above multiple access technologies have been adopted in various telecommunication standards to provide a common protocol that enables different user equipment to communicate on a municipal, national, regional, and even global level. NR, which may also be referred to as 5G, is a set of enhancements to the LTE mobile standard promulgated by the 3GPP. NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some aspects, a method of wireless communication, performed by a transmitter device, may include segmenting a plurality of bits of a communication into a first set of bits and a second set of bits; processing the first set of bits using a first processing chain and the second set of bits using a second processing chain, wherein the first set of bits is mapped to most significant bits (MSBs) of one or more symbols of a composite constellation and the second set of bits is mapped to least significant bits (LSBs) of the one or more symbols of the composite constellation, and wherein the composite constellation is formed from a plurality of lower order constellations; modulating the first set of bits and the second set of bits to generate a set of modulated symbols; and transmitting the set of modulated symbols.

In some aspects, a method of wireless communication, performed by a receiver device, may include receiving a set of modulated symbols of a communication; decoding LSB log likelihood ratios (LLRs) of the set of modulated symbols to obtain a first set of bits of the communication; performing a cyclic redundancy check on the first set of bits of the communication based at least in part on decoding the LSB LLRs of the set of modulated symbols to obtain the first set of bits; decoding MSB LLRs of the set of modulated symbols to obtain a second set of bits of the communication based at least in part on a result of performing the cyclic redundancy check on the first set of bits; and interpreting the communication based at least in part on decoding the MSB LLRs of the set of modulated symbols to obtain the second set of bits of the communication.

In some aspects, a transmitter device for wireless communication may include a memory and one or more processors coupled to the memory. The memory and the one or more processors may be configured to segment a plurality of bits of a communication into a first set of bits and a second set of bits; process the first set of bits using a first processing chain and the second set of bits using a second processing chain, wherein the first set of bits is mapped to MSBs of one or more symbols of a composite constellation and the second set of bits is mapped to LSBs of the one or more symbols of the composite constellation, and wherein the composite constellation is formed from a plurality of lower order constellations; modulate the first set of bits and the second set of bits to generate a set of modulated symbols; and transmit the set of modulated symbols.

In some aspects, a receiver device for wireless communication may include a memory and one or more processors coupled to the memory. The memory and the one or more processors may be configured to receive a set of modulated symbols of a communication; decode LSB LLRs of the set of modulated symbols to obtain a first set of bits of the communication; perform a cyclic redundancy check on the first set of bits of the communication based at least in part on decoding the LSB LLRs of the set of modulated symbols to obtain the first set of bits; decode MSB LLRs of the set of modulated symbols to obtain a second set of bits of the communication based at least in part on a result of performing the cyclic redundancy check on the first set of bits; and interpret the communication based at least in part on decoding the MSB LLRs of the set of modulated symbols to obtain the second set of bits of the communication.

In some aspects, a non-transitory computer-readable medium may store one or more instructions for wireless communication. The one or more instructions, when executed by one or more processors of a transmitter device, may cause the one or more processors to segment a plurality of bits of a communication into a first set of bits and a second set of bits; process the first set of bits using a first processing chain and the second set of bits using a second processing chain, wherein the first set of bits is mapped to MSBs of one or more symbols of a composite constellation and the second set of bits is mapped to LSBs of the one or more symbols of the composite constellation, and wherein the composite constellation is formed from a plurality of lower order constellations; modulate the first set of bits and the second set of bits to generate a set of modulated symbols; and transmit the set of modulated symbols.

In some aspects, a non-transitory computer-readable medium may store one or more instructions for wireless communication. The one or more instructions, when executed by one or more processors of a receiver device, may cause the one or more processors to receive a set of modulated symbols of a communication; decode LSB LLRs of the set of modulated symbols to obtain a first set of bits of the communication; perform a cyclic redundancy check on the first set of bits of the communication based at least in part on decoding the LSB LLRs of the set of modulated symbols to obtain the first set of bits; decode MSB LLRs of the set of modulated symbols to obtain a second set of bits of the communication based at least in part on a result of performing the cyclic redundancy check on the first set of bits; and interpret the communication based at least in part on decoding the MSB LLRs of the set of modulated symbols to obtain the second set of bits of the communication.

In some aspects, an apparatus for wireless communication may include means for segmenting a plurality of bits of a communication into a first set of bits and a second set of bits; means for processing the first set of bits using a first processing chain and the second set of bits using a second processing chain, wherein the first set of bits is mapped to MSBs of one or more symbols of a composite constellation and the second set of bits is mapped to LSBs of the one or more symbols of the composite constellation, and wherein the composite constellation is formed from a plurality of lower order constellations; means for modulating the first set of bits and the second set of bits to generate a set of modulated symbols; and means for transmitting the set of modulated symbols.

In some aspects, an apparatus for wireless communication may include means for receiving a set of modulated symbols of a communication; means for decoding LSB LLRs of the set of modulated symbols to obtain a first set of bits of the communication; means for performing a cyclic redundancy check on the first set of bits of the communication based at least in part on decoding the LSB LLRs of the set of modulated symbols to obtain the first set of bits; means for decoding MSB LLRs of the set of modulated symbols to obtain a second set of bits of the communication based at least in part on a result of performing the cyclic redundancy check on the first set of bits; and means for interpreting the communication based at least in part on decoding the MSB LLRs of the set of modulated symbols to obtain the second set of bits of the communication.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, or artificial intelligence-enabled devices). Aspects may be implemented in chip-level components, modular components, non-modular components, non-chip-level components, device-level components, or system-level components. Devices incorporating described aspects and features may include additional components and features for implementation and practice of claimed and described aspects. For example, transmission and reception of wireless signals may include a number of components for analog and digital purposes (e.g., hardware components including antennas, RF chains, power amplifiers, modulators, buffers, processor(s), interleavers, adders, or summers). It is intended that aspects described herein may be practiced in a wide variety of devices, components, systems, distributed arrangements, or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with a 5G or NR radio access technology (RAT), aspects of the present disclosure can be applied to other RATs, such as a 3G RAT, a 4G RAT, and/or a RAT subsequent to 5G (e.g., 6G).

Figure 1:
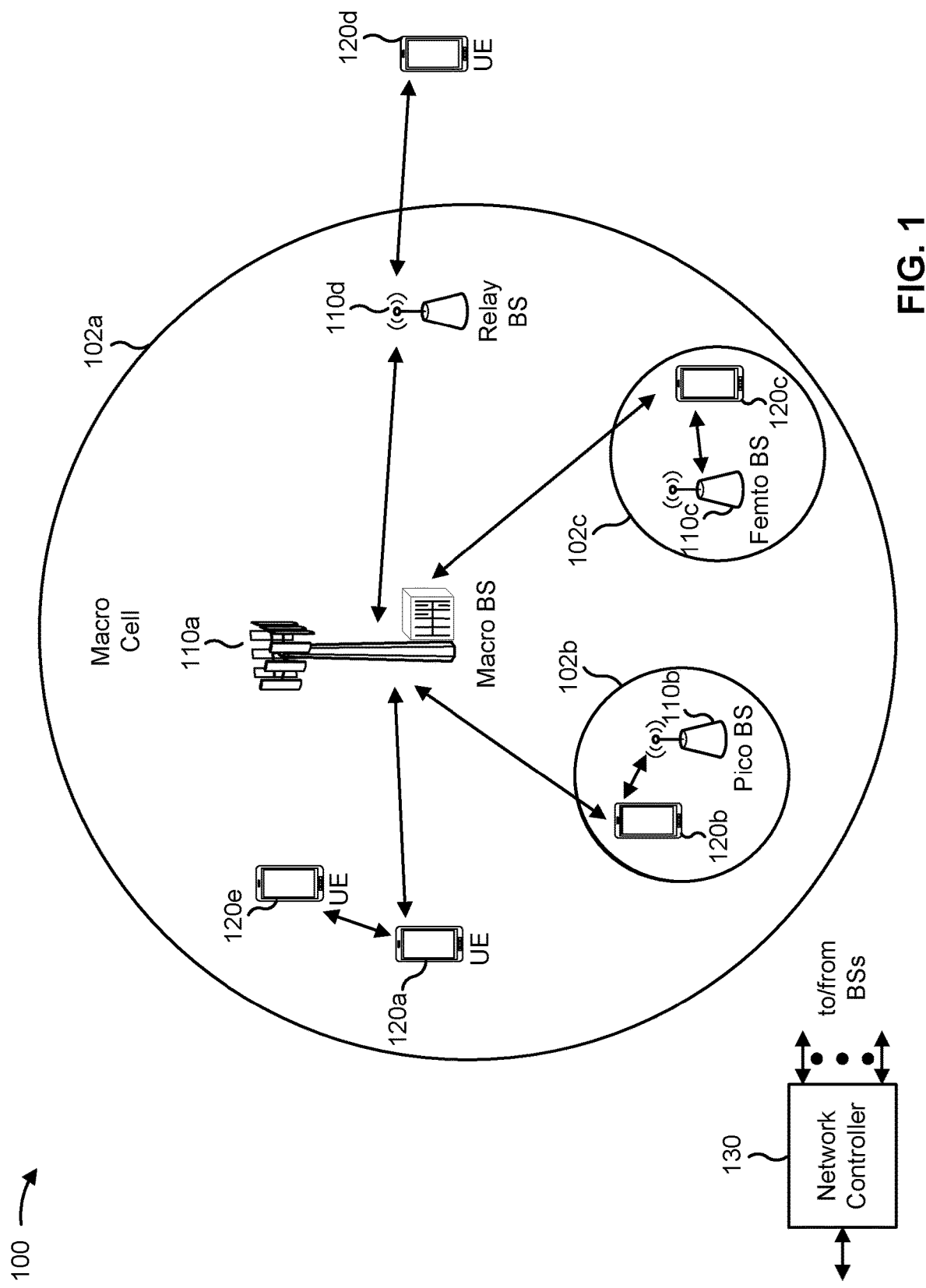
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (NR) network and/or an LTE network, among other examples. The wireless network 100 may include a number of base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, a transmit receive point (TRP), or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces, such as a direct physical connection or a virtual network, using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, a relay, or the like.

Wireless network 100 may be a heterogeneous network that includes BSs of different types, such as macro BSs, pico BSs, femto BSs, relay BSs, or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, and/or location tags, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components and/or memory components. In some aspects, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks may be deployed in a given geographic area. Each wireless network may support a particular RAT and may operate on one or more frequencies. A RAT may also be referred to as a radio technology, an air interface, or the like. A frequency may also be referred to as a carrier, a frequency channel, or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol or a vehicle-to-infrastructure (V2I) protocol), and/or a mesh network. In this case, the UE 120 may perform scheduling operations, resource selection operations, and/or other operations described elsewhere herein as being performed by the base station 110.

Devices of wireless network 100 may communicate using the electromagnetic spectrum, which may be subdivided based on frequency or wavelength into various classes, bands, channels, or the like. For example, devices of wireless network 100 may communicate using an operating band having a first frequency range (FR1), which may span from 410 MHz to 7.125 GHz, and/or may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz—300 GHz) which is identified by the International Telecommunications Union (ITU) as a "millimeter wave" band. Thus, unless specifically stated otherwise, it should be understood that the term "sub-6 GHz" or the like, if used herein, may broadly represent frequencies less than 6 GHz, frequencies within FR1, and/or mid-band frequencies (e.g., greater than 7.125 GHz). Similarly, unless specifically stated otherwise, it should be understood that the term "millimeter wave" or the like, if used herein, may broadly represent frequencies within the EHF band, frequencies within FR2, and/or mid-band frequencies (e.g., less than 24.25 GHz). It is contemplated that the frequencies included in FR1 and FR2 may be modified, and techniques described herein are applicable to those modified frequency ranges.

As indicated above, FIG. 1 is provided as an example. Other examples may differ from what is described with regard to FIG. 1.

Figure 2:
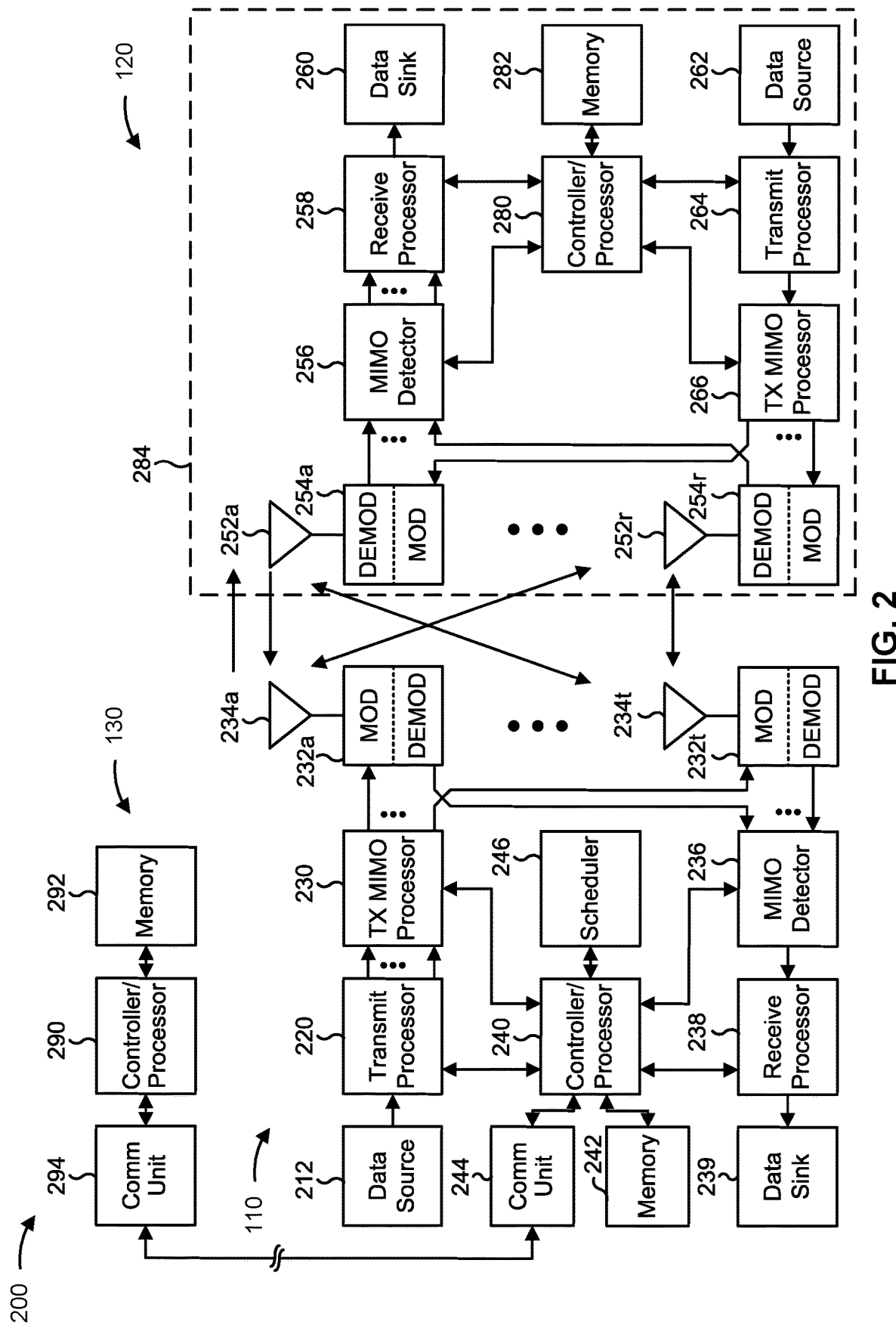
FIG. 2 is a diagram illustrating an example of a base station in communication with a UE in a wireless network, in accordance with the present disclosure.

FIG. 2 is a diagram illustrating an example 200 of a base station 110 in communication with a UE 120 in a wireless network 100, in accordance with the present disclosure. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI)) and control information (e.g., CQI requests, grants, and/or upper layer signaling) and provide overhead symbols and control symbols. Transmit processor 220 may also generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a channel quality indicator (CQI) parameter, among other examples. In some aspects, one or more components of UE 120 may be included in a housing 284.

Network controller 130 may include communication unit 294, controller/processor 290, and memory 292. Network controller 130 may include, for example, one or more devices in a core network. Network controller 130 may communicate with base station 110 via communication unit 294.

Antennas (e.g., antennas 234a through 234t and/or antennas 252a through 252r) may include, or may be included within, one or more antenna panels, antenna groups, sets of antenna elements, and/or antenna arrays, among other examples. An antenna panel, an antenna group, a set of antenna elements, and/or an antenna array may include one or more antenna elements. An antenna panel, an antenna group, a set of antenna elements, and/or an antenna array may include a set of coplanar antenna elements and/or a set of non-coplanar antenna elements. An antenna panel, an antenna group, a set of antenna elements, and/or an antenna array may include antenna elements within a single housing and/or antenna elements within multiple housings. An antenna panel, an antenna group, a set of antenna elements, and/or an antenna array may include one or more antenna elements coupled to one or more transmission and/or reception components, such as one or more components of FIG. 2.

On the uplink, at UE 120, a transmit processor 264 may receive and process data from a data source 262 and control information (e.g., for reports that include RSRP, RSSI, RSRQ, and/or CQI) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM or CP-OFDM), and transmitted to base station 110. In some aspects, a modulator and a demodulator (e.g., MOD/DEMOD 254) of the UE 120 may be included in a modem of the UE 120. In some aspects, the UE 120 includes a transceiver. The transceiver may include any combination of antenna(s) 252, modulators and/or demodulators 254, MIMO detector 256, receive processor 258, transmit processor 264, and/or TX MIMO processor 266. The transceiver may be used by a processor (e.g., controller/processor 280) and memory 282 to perform aspects of any of the methods described herein, for example, as described with reference to FIGS. 3A-3C.

At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and/or uplink communications. In some aspects, a modulator and a demodulator (e.g., MOD/DEMOD 232) of the base station 110 may be included in a modem of the base station 110. In some aspects, the base station 110 includes a transceiver. The transceiver may include any combination of antenna(s) 234, modulators and/or demodulators 232, MIMO detector 236, receive processor 238, transmit processor 220, and/or TX MIMO processor 230. The transceiver may be used by a processor (e.g., controller/processor 240) and memory 242 to perform aspects of any of the methods described herein, for example, as described with reference to FIGS. 3A-3C.

Controller/processor 240 of base station 110, controller/processor 280 of UE 120, and/or any other component(s) of FIG. 2 may perform one or more techniques associated with multi-level channel coding for wireless communications, as described in more detail elsewhere herein. For example, controller/processor 240 of base station 110, controller/processor 280 of UE 120, and/or any other component(s) of FIG. 2 may perform or direct operations of, for example, process 400 of FIG. 4, process 500 of FIG. 5, and/or other processes as described herein. Memories 242 and 282 may store data and program codes for base station 110 and UE 120, respectively. In some aspects, memory 242 and/or memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 400 of FIG. 4, process 500 of FIG. 5, and/or other processes as described herein. In some aspects, executing instructions may include running the instructions, converting the instructions, compiling the instructions, and/or interpreting the instructions, among other examples.

In some aspects, a transmitter device may include means for segmenting a plurality of bits of a communication into a first set of bits and a second set of bits, means for processing the first set of bits using a first processing chain and the second set of bits using a second processing chain, means for modulating the first set of bits and the second set of bits to generate a set of modulated symbols, means for transmitting the set of modulated symbols, and/or the like. In some aspects, such means may include one or more components of UE 120 described in connection with FIG. 2, such as controller/processor 280, transmit processor 264, TX MIMO processor 266, MOD 254, antenna 252, and/or the like. In some aspects, such means may include one or more components of base station 110 described in connection with FIG. 2, such as antenna 234, controller/processor 240, transmit processor 220, TX MIMO processor 230, MOD 232, and/or the like.

In some aspects, a receiver device may include means for receiving a set of modulated symbols of a communication, means for decoding least significant bit (LSB) log likelihood ratios (LLRs) of the set of modulated symbols to obtain a first set of bits of the communication, means for performing a cyclic redundancy check on the first set of bits of the communication based at least in part on decoding the LSB LLRs of the set of modulated symbols to obtain the first set of bits, means for decoding most significant bit (MSB) LLRs of the set of modulated symbols to obtain a second set of bits of the communication based at least in part on a result of performing the cyclic redundancy check on the first set of bits, means for interpreting the communication based at least in part on decoding the MSB LLRs of the set of modulated symbols to obtain the second set of bits of the communication, and/or the like. In some aspects, such means may include one or more components of UE 120 described in connection with FIG. 2, such as controller/processor 280, antenna 252, DEMOD 254, MIMO detector 256, receive processor 258, and/or the like. In some aspects, such means may include one or more components of base station 110 described in connection with FIG. 2, such as antenna 234, DEMOD 232, MIMO detector 236, receive processor 238, controller/processor 240, and/or the like.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of controller/processor 280.

As indicated above, FIG. 2 is provided as an example. Other examples may differ from what is described with regard to FIG. 2.

In some communications systems, receiver devices may use coherent detection. For example, a receiver device of a BS may use coherent detection to receive signaling from a transmitter device of a UE. Similarly, a receiver device of the UE may use coherent detection to receive signaling from a transmitter device of the BS. In coherent detection, a receiver device may perform channel equalization based at least in part on a channel response. The receiver device may determine the channel response based at least in part on a measurement of a reference signal. For example, a receiver device may receive a demodulation reference signal (DMRS) from a transmitter device, may estimate a channel based at least in part on the DMRS, and may de-modulate a communication from the transmitter device based at least in part on estimating the channel. However, transmitting the reference signal may use available network resources as well as using processing resources, power resources, and/or the like to perform the transmission.

To reduce a utilization of network resources and thus improve spectral efficiency, some receiver devices may use non-coherent detection. In non-coherent detection, the receiver device may receive a transmission without having used a reference signal to estimate a channel, thereby reducing a utilization of network resources for communication. Moreover, by obviating a need for channel estimation and equalization, receiver complexity may be reduced, thereby enabling low-complexity deployments, such as in eMTC communications, V2X communications, V2V communications, and/or the like. In non-coherent detection, other signal processing techniques may be used to account for signal distortion at the receiver device (e.g., distortion relating to fading, interference, and/or the like). For example, the transmitter device may perform differential encoding and the receiver device may perform differential decoding to mitigate signal distortion from fading.

As an example, for orthogonal frequency division multiplexing (OFDM) systems with an available frequency bandwidth of N subcarriers, up to N modulation symbols may be transmitted in an OFDM symbol. The modulation symbol in the OFDM symbol is denoted as $s_k$, where k ranges from 0 to N-1. Transmitted symbols in the OFDM symbol may be represented as $x_k$. As a result, a transmitter device may perform differential encoding such that $x_k = x_{k-1} \cdot s_k$, where $x_0 = s_0$. On a receiver device side, the receiver device may perform differential decoding such that $\hat{s}_k = \text{conj}(y_{k-1}) \cdot y_k$.

The transmitter device may use phase-shift keying (PSK) to modulate OFDM symbols for transmission to the receiver device. For example, the transmitter device may use 4PSK, 8PSK, 16PSK, and/or the like. As a result, transmitted symbols (e.g., symbols formed after differential encoding, $x_k$) are at constellation points of a modulation constellation. However, in PSK modulation, information is conveyed by phase, which may result in performance degradation with increasing modulation orders. For example, at higher modulation orders (e.g., 8PSK, 16PSK, 32PSK, and/or the like), bits of a modulation symbol may have unequal protection. In this case, least significant bits (LSBs) of a modulation symbol may be less protected than most significant bits (MSBs) for higher modulation orders. As a result, when the receiver device determines log likelihood ratios (LLRs) for each bit, LLRs for LSBs are less reliable (e.g., more vulnerable to noise) than LLRs for MSBs.

Some aspects described herein provide multi-level encoding for higher-order modulation schemes used in non-coherent transmission. For example, a transmitter device may use a composite constellation, which is formed from a plurality of modulation constellations for lower-order modulation schemes, for a higher-order modulation scheme and may separately process a plurality of sets of bits to form symbols in the composite constellation. In this way, the transmitter device enables improved reliability for LSB LLR processing at a receiver device, thereby enabling use of a higher modulation order in non-coherent communications for improved utilization of network resources without experiencing degraded performance from using the higher modulation order.

Figure 3A:
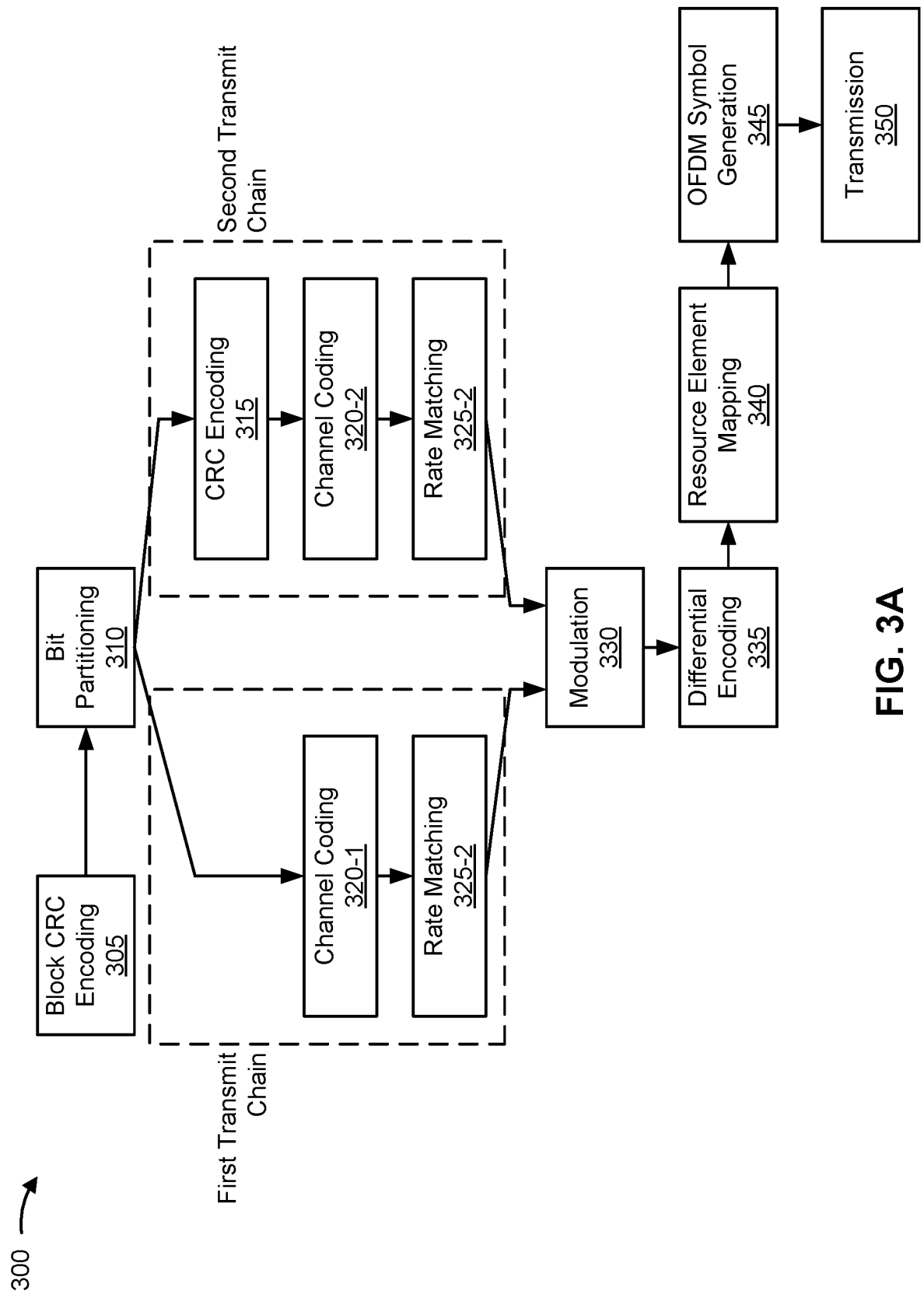
FIGS. 3A-3C are diagrams illustrating examples associated with a transmitter device and a receiver device that perform multi-level channel coding for wireless communications, in accordance with the present disclosure.
Figure 3B:
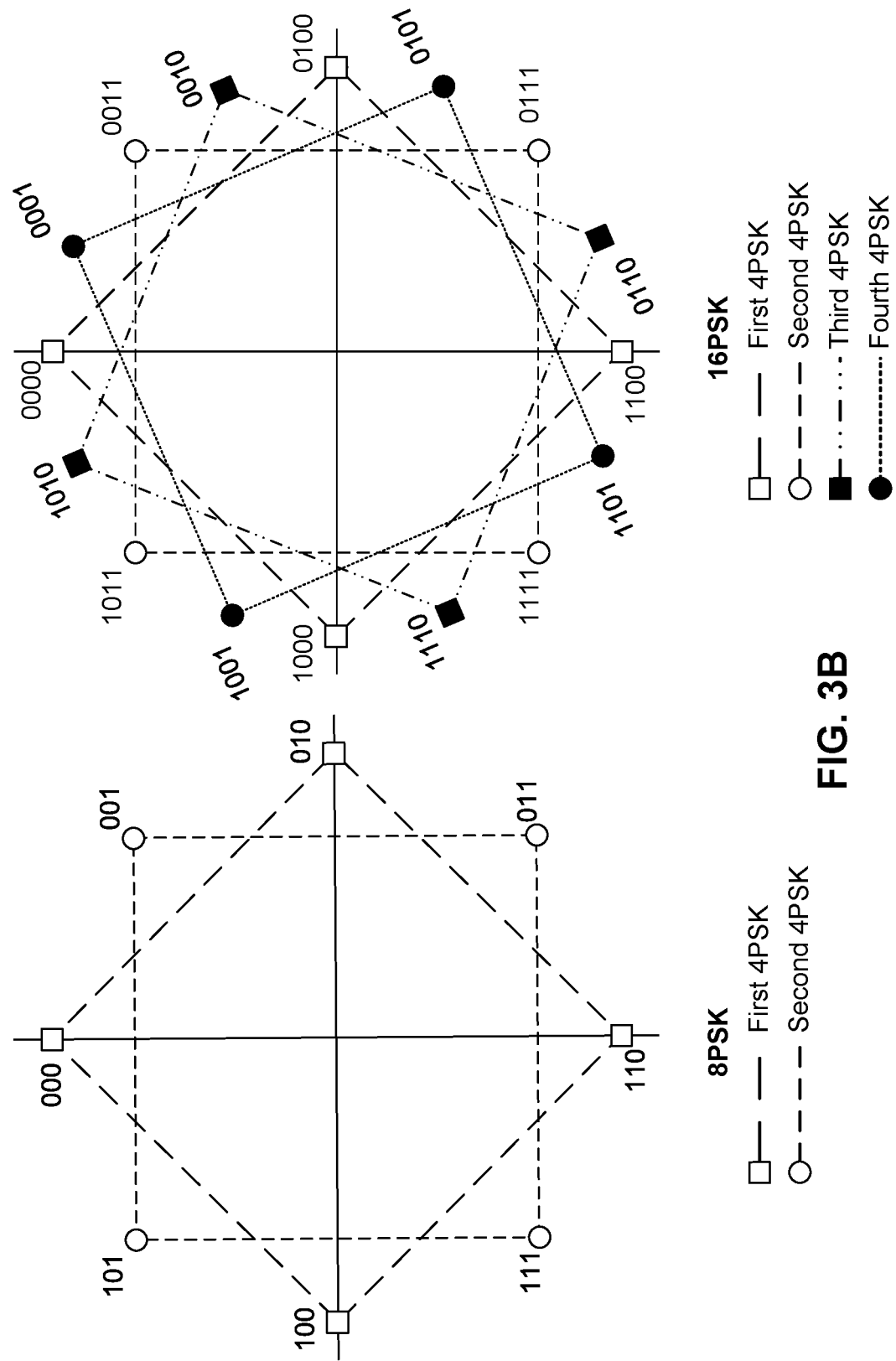
Figure 3C:
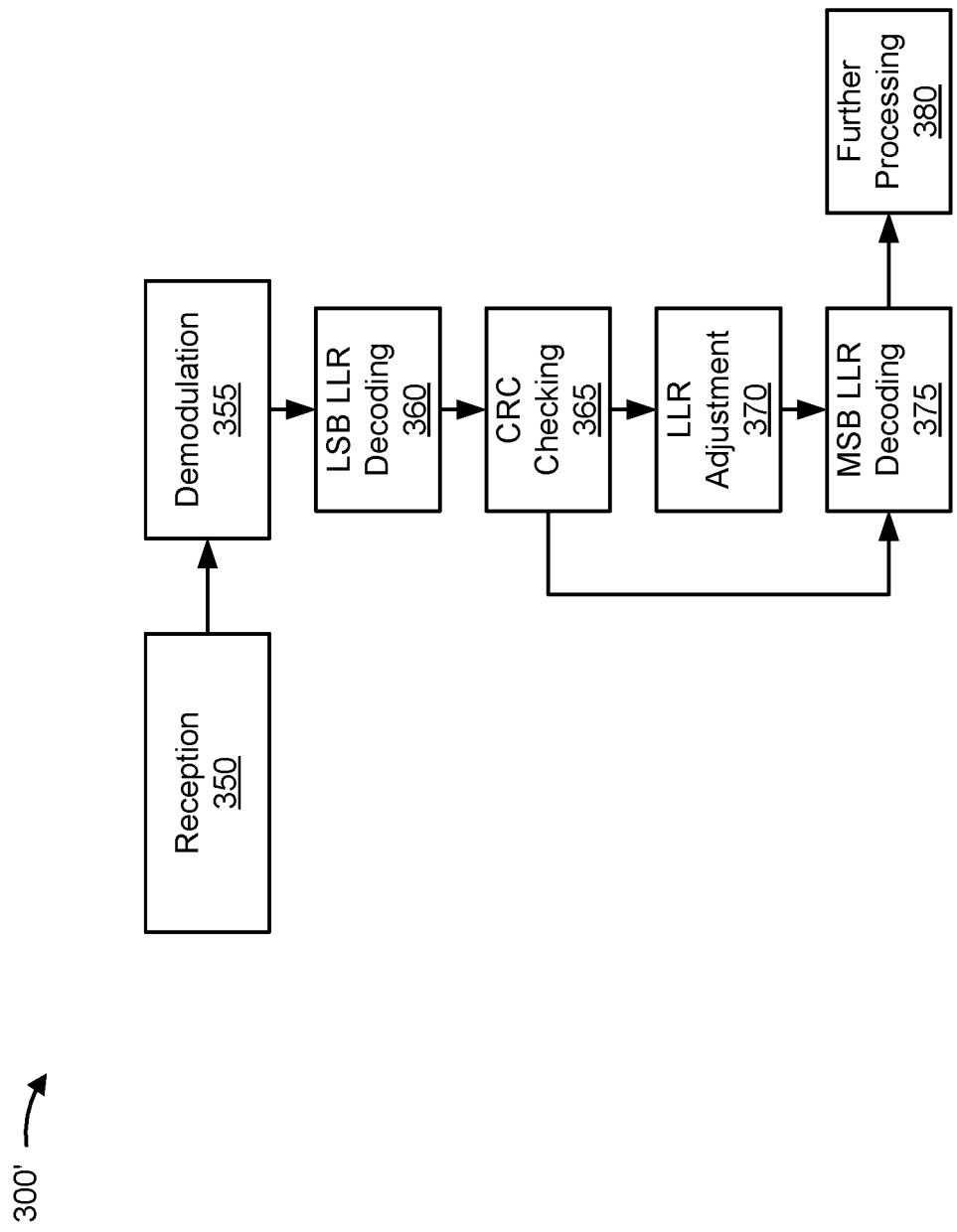

FIGS. 3A-3C are diagrams illustrating a transmitter device 300 and a receiver device 300' that perform multi-level channel coding for wireless communications, in accordance with the present disclosure. FIG. 3A shows an example of functional components of transmitter device 300 (e.g., which may correspond to BS 110, UE 120, and/or the like). FIG. 3B shows examples of composite constellations used for higher-order PSK modulation. FIG. 3C shows an example of functional components of receiver device 300' (e.g., which may correspond to BS 110, UE 120, and/or the like).

As further shown in FIG. 3A, and by block 305, transmitter device 300 may perform block cyclic redundancy check (CRC) encoding. For example, transmitter device 300 may obtain information bits, which may form a transport block or a code block, for transmission and may encode the information bits with parity bits for enabling a CRC to be performed by receiver device 300'.

As further shown in FIG. 3A, and by block 310, transmitter device 300 may perform bit partitioning. For example, transmitter device 300 may divide information bits of a transport block or code block into a plurality of sets of bits. In this case, transmitter device 300 may divide the information bits into a first set of bits for processing using a first processing chain, a second set of bits for processing using a second processing chain, and/or the like. In some aspects, the information bits may include parity bits. For example, based at least in part on transmitter device 300 performing block CRC encoding, transmitter device 300 may include CRC bits with the information bits.

As further shown in FIG. 3A, and by blocks 315-325, transmitter device 300 may perform CRC encoding, channel coding, and rate matching on the first set of bits and/or the second set of bits using a first transmit chain and/or a second transmit chain, respectively. For example, transmitter device 300 may attach parity bits to the second set of bits to enable a CRC of LSBs to which the second set of bits are mapped, as described in more detail herein. In some aspects, transmitter device 300 may use the same CRC polynomial that is used to block CRC encoding described above. Additionally, or alternatively, transmitter device 300 may use a different CRC polynomial for adding parity bits to the second set of bits that will be encoded as LSBs. Additionally, or alternatively, transmitter device 300 may use, for example, a shorter CRC for the LSBs relative to a CRC used for a transport block or code block, as described above. In another case, transmitter device 300 may omit a CRC from the code block or transport block and may include separate CRCs for the LSB and MSB bits. In this case, as described below, receiver device 300' may determine that code block or transport block decoding is successful based at least in part on a successful CRC for the LSB bits and a successful CRC for the MSB bits. In another case, transmitter device 300 may include three CRCs for a code block or transport block, for the LSB bits and for the MSB bits (e.g., each may include a different length CRC), respectively. In this case, receiver device 300' may determine that code block or transport block decoding is successful based at least in part on all three CRCs being successful.

In some aspects, transmitter device 300 may encode the first set of bits and the second set of bits using different coding schemes. For example, transmitter device 300 may encode the first set of bits using low-density parity-check (LDPC) coding in the first transmit chain and may encode the second set of bits using polar coding in the second transmit chain. In some aspects, transmitter device 300 may encode the first set of bits and the second set of bits, independently, using the same coding scheme. For example, transmitter device 300 may encode the first set of bits using LDPC coding in the first transmit chain and the second set of bits using LDPC coding in the second transmit chain, such that the first set of bits and the second set of bits are encoded independently. In this case, transmitter device 300 may use a first coding rate for the first set of bits and a second coding rate, that is different from the first coding rate, for the second set of bits. In some aspects, transmitter device 300 may select the coding rates based at least in part on a bit value. For example, transmitter device 300 may encode a set of bits that correspond to MSBs (e.g., the first set of bits) with a higher coding rate than a set of bits that correspond to LSBs (e.g., the second set of bits).

In some aspects, transmitter device 300 may modulate encoded bits to a composite constellation. For example, transmitter device 300 may map the first set of bits to MSBs of symbols in a composite constellation and the second set of bits to LSBs of symbols in the composite constellation. In this case, the MSBs may represent a first 2 bits of an 8PSK symbol, a first 2 or 3 bits of a 16PSK symbol, and/or the like and the LSBs may represent a last 1 bit of the 8PSK symbol, a last 1 or 2 bits of the 16PSK symbol, and/or the like. The composite constellation may be a higher order constellation formed from a plurality of lower order constellations. For example, as shown in FIG. 3B, an 8PSK constellation may be a higher order constellation formed from a first 4PSK constellation and a second 4PSK constellation. Similarly, as shown in FIG. 3B, a 16PSK constellation may be a higher order constellation formed from a set of four 4PSK constellations. Although some aspects are described in terms of a particular set of higher order constellations and lower order constellations, other arrangements are possible, such as a 16PSK constellation formed from two 8PSK constellations, a 32PSK constellation formed from four 8PSK constellations, and/or the like.

In some aspects, transmitter device 300 may rate match each set of bits after the channel coding. For example, transmitter device 300 may ensure that a bit length matches a quantity of bits that can be transmitted in connection with a selected modulation order and a quantity of available resource elements. In this case, transmitter device 300 may rate match bits from each transmit chain to fit a corresponding part (e.g., MSBs or LSBs) of a modulation symbol based at least in part on a modulation order, a ratio of MSBs to LSBs, a quantity of modulation symbols, and/or the like.

As further shown in FIG. 3A, and by blocks 330-345, transmitter device 300 may process the two sets of bits to prepare for transmission. For example, based at least in part on rate matching, transmitter device 300 may modulate the two sets of bits, perform differential encoding, perform resource element mapping, generate orthogonal frequency division multiplexing (OFDM) symbols, and/or the like. In this way, and as shown by block 350, transmitter device 300 may generate a transmission for a higher order PSK-type of modulation.

As shown in FIG. 3C, and by blocks 350 and 355, based at least in part on receiving a transmission from transmitter device 300, receiver device 300' may demodulate received symbols. For example, receiver device 300' may demodulate OFDM symbols and determine log-likelihood-ratios (LLRs) from demodulated symbols, as shown by block 360. At block 360, receiver device 300' may decode LSB LLRs to identify decoded bits of the second set of bits. At block 365, receiver device 300' may perform a checksum on CRC bits of the second set of bits to determine whether the LSB LLRs are successfully decoded.

In this case, at block 370 and 375, when the checksum is successful, receiver device 300' may reencode decoded bits of the LSBs, adjust MSB LLR values based at least in part on the reencoded bits, and decode adjusted LLRs to obtain information bits mapped to the MSBs (e.g., the first set of bits). For example, in 8PSK modulation, receiver device 300' may adjust a pair of LLRs from a set of MSBs based at least in part on a corresponding LSB value. In this case, when receiver device 300' is to decode the MSB LLRs, receiver device 300' decodes the MSB LLRs as 4PSK modulated symbols, thereby improve decoding performance. In other words, when the composite constellation for 8PSK modulation is formed from a first 4PSK constellation and a second 4PSK constellation, receiver device 300' identifies whether an MSB is formed from the first 4PSK constellation or the second 4PSK constellation based at least in part on an LSB LLR. In this case, receiver device 300' decodes the MSB based on the identified 4PSK constellation, thereby improve performance relative to attempting to decode the MSB directly from an 8PSK constellation. Additionally, or alternatively, based at least in part on the checksum being unsuccessful, receiver device 300' may decode the MSB LLRs without adjusting the MSB LLRs based at least in part on the LSB LLRs.

At block 380, based at least in part on decoding the MSBs, receiver device 300' may perform any further processing to recover information transmitted by transmitter device 300. For example, receiver device 300' may determine whether code block or transport block decoding is successful based at least in part on whether one or more included CRCs is successful (e.g., a CRC of the LSBs, a CRC of the MSBs, a CRC of a code block or transport block, and/or the like, as described above). Additionally, or alternatively, receiver device 300' may interpret recovered bits of the received information to identify a message from transmitter device 300, such as control signaling, data transmission, and/or the like.

As indicated above, FIGS. 3A-3C are provided as an example. Other examples may differ from what is described with respect to FIGS. 3A-3C.

Figure 4:
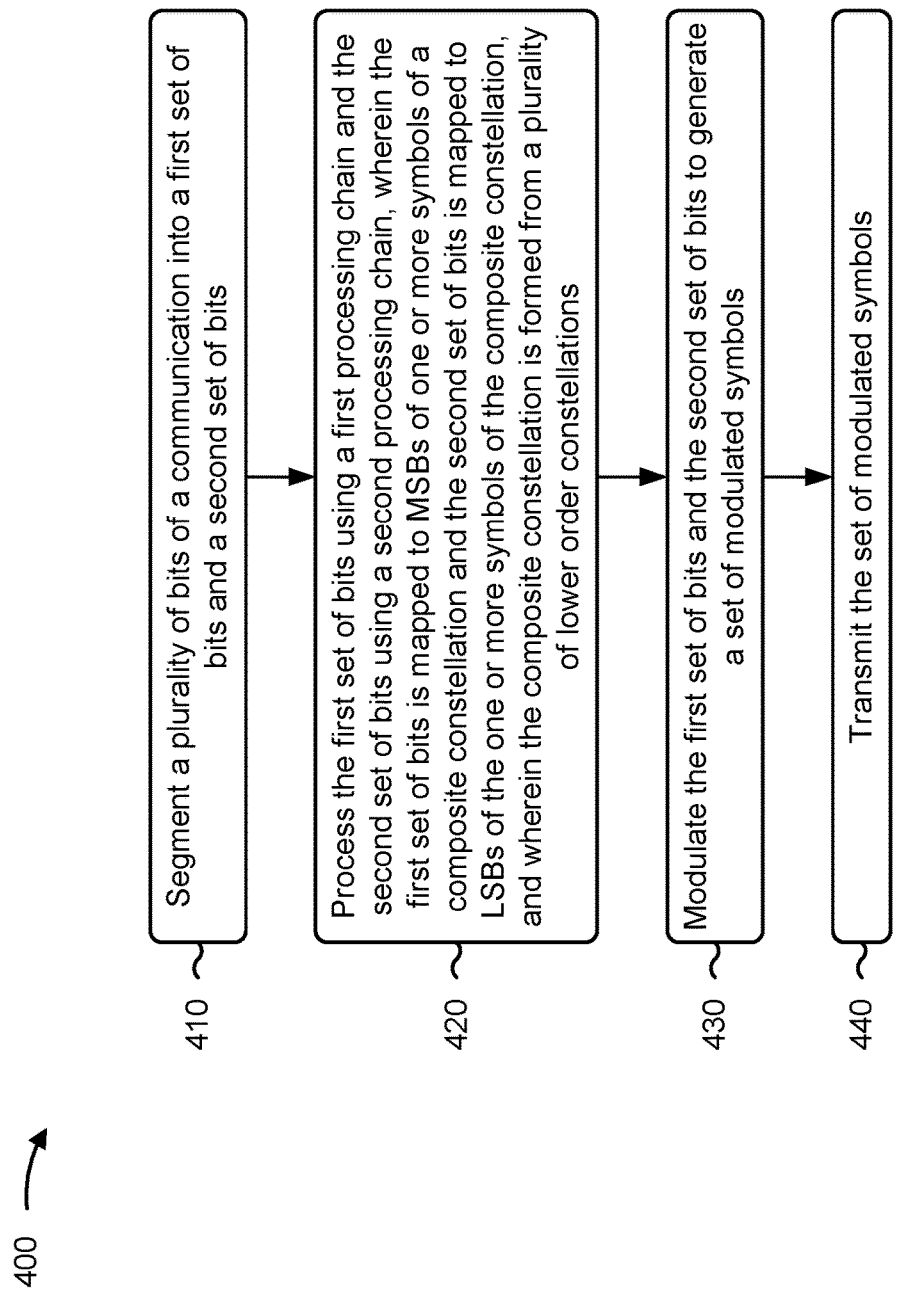
FIGS. 4-5 are diagrams illustrating example processes associated with performing multi-level channel coding for wireless communications, in accordance with the present disclosure.

FIG. 4 is a diagram illustrating an example process 400 performed, for example, by a transmitter device, in accordance with the present disclosure. Example process 400 is an example where the transmitter device (e.g., BS 110, UE 120, transmitter device 300, and/or the like) performs operations associated with multi-level channel coding for wireless communications.

As shown in FIG. 4, in some aspects, process 400 may include segmenting a plurality of bits of a communication into a first set of bits and a second set of bits (block 410). For example, the transmitter device (e.g., using controller/processor 240, transmit processor 220, TX MIMO processor 230, MOD 232, antenna 234, controller/processor 280, transmit processor 264, TX MIMO processor 266, MOD 254, antenna 252, and/or the like) may segment a plurality of bits of a communication into a first set of bits and a second set of bits, as described above.

As further shown in FIG. 4, in some aspects, process 400 may include processing the first set of bits using a first processing chain and the second set of bits using a second processing chain, wherein the first set of bits is mapped to MSBs of one or more symbols of a composite constellation and the second set of bits is mapped to LSBs of the one or more symbols of the composite constellation, and wherein the composite constellation is formed from a plurality of lower order constellations (block 420). For example, the transmitter device (e.g., using controller/processor 240, transmit processor 220, TX MIMO processor 230, MOD 232, antenna 234, controller/processor 280, transmit processor 264, TX MIMO processor 266, MOD 254, antenna 252, and/or the like) may process the first set of bits using a first processing chain and the second set of bits using a second processing chain, as described above. In some aspects, the first set of bits is mapped to MSBs of one or more symbols of a composite constellation and the second set of bits is mapped to LSBs of the one or more symbols of the composite constellation. In some aspects, the composite constellation is formed from a plurality of lower order constellations.

As further shown in FIG. 4, in some aspects, process 400 may include modulating the first set of bits and the second set of bits to generate a set of modulated symbols (block 430). For example, the transmitter device (e.g., using controller/processor 240, transmit processor 220, TX MIMO processor 230, MOD 232, antenna 234, controller/processor 280, transmit processor 264, TX MIMO processor 266, MOD 254, antenna 252, and/or the like) may modulate the first set of bits and the second set of bits to generate a set of modulated symbols, as described above.

As further shown in FIG. 4, in some aspects, process 400 may include transmitting the set of modulated symbols (block 440). For example, the transmitter device (e.g., using controller/processor 240, transmit processor 220, TX MIMO processor 230, MOD 232, antenna 234, controller/processor 280, transmit processor 264, TX MIMO processor 266, MOD 254, antenna 252, and/or the like) may transmit the set of modulated symbols, as described above.

Process 400 may include additional aspects, such as any single aspect or any combination of aspects described below and/or in connection with one or more other processes described elsewhere herein.

In a first aspect, the composite constellation is a higher order phase shift keying (PSK) constellation formed by a plurality of lower order PSK constellations.

In a second aspect, alone or in combination with the first aspect, process 400 includes encoding the first set of bits using a first coding scheme and the second set of bits using a second coding scheme.

In a third aspect, alone or in combination with one or more of the first and second aspects, process 400 includes encoding the first set of bits using a first coding rate and the second set of bits using a second coding rate.

In a fourth aspect, alone or in combination with one or more of the first through third aspects, process 400 includes rate matching the coded first set of bits and the coded second set of bits.

In a fifth aspect, alone or in combination with one or more of the first through fourth aspects, process 400 includes adding parity bits to the second set of bits.

In a sixth aspect, alone or in combination with one or more of the first through fifth aspects, the parity bits of the second set of bits is different from parity bits, of the plurality of bits, associated with a code block or transport block of the communication.

In a seventh aspect, alone or in combination with one or more of the first through sixth aspects, transmitting the set of modulated symbols includes transmitting the set of modulated symbols based at least in part on a result of the differential encoding, the resource element mapping, and the OFDM symbol generation.

Although FIG. 4 shows example blocks of process 400, in some aspects, process 400 may include additional blocks, fewer blocks, different blocks, or differently arranged blocks than those depicted in FIG. 4. Additionally, or alternatively, two or more of the blocks of process 400 may be performed in parallel.

Figure 5:
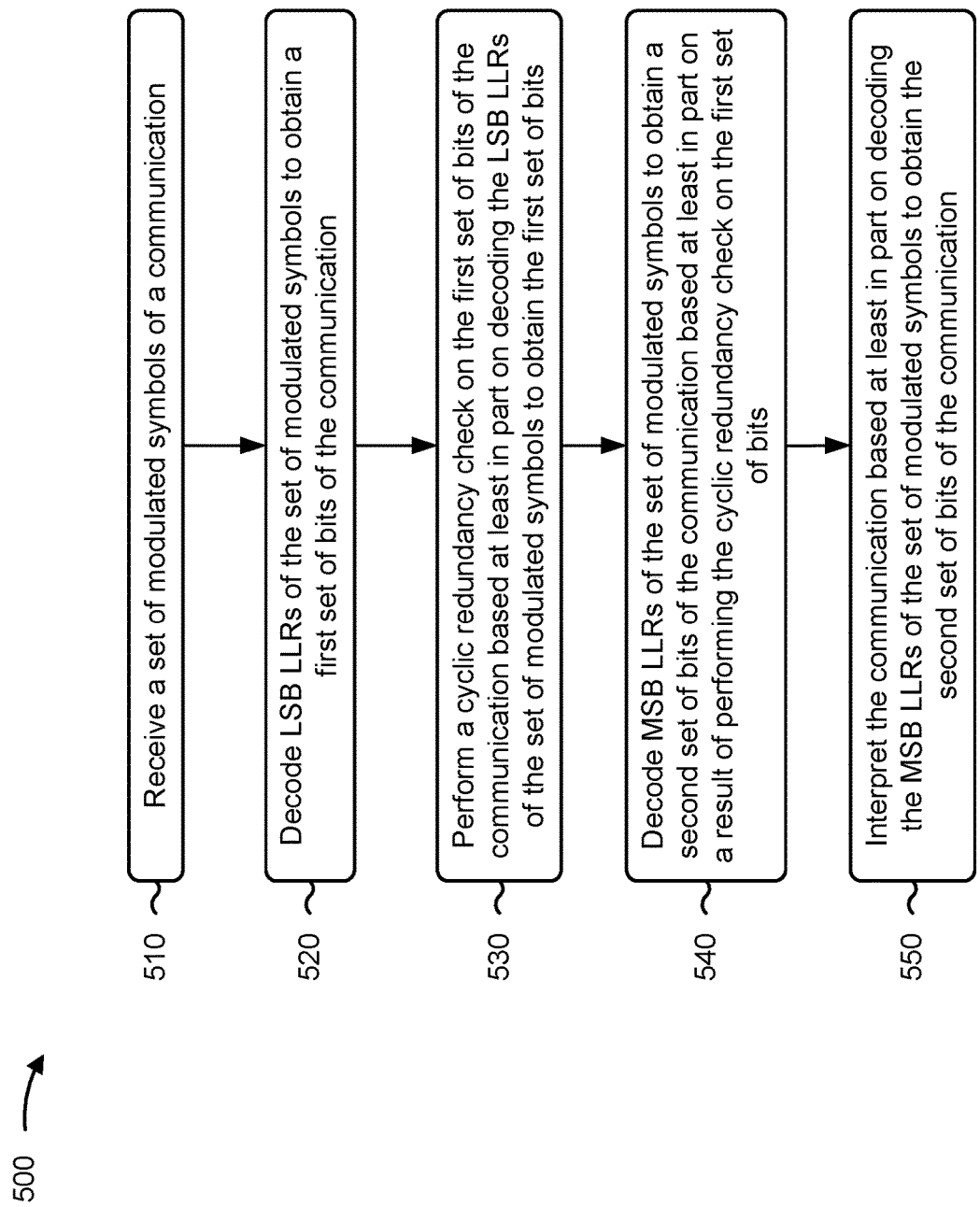

FIG. 5 is a diagram illustrating an example process 500 performed, for example, by a receiver device, in accordance with the present disclosure. Example process 500 is an example where the receiver device (e.g., BS 110, UE 120, receiver device 300' and/or the like) performs operations associated with multi-level channel coding for wireless communications.

As shown in FIG. 5, in some aspects, process 500 may include receiving a set of modulated symbols of a communication (block 510). For example, the receiver device (e.g., using antenna 234, DEMOD 232, MIMO detector 236, receive processor 238, controller/processor 240, antenna 252, DEMOD 254, MIMO detector 256, receive processor 258, controller/processor 280, and/or the like) may receive a set of modulated symbols of a communication, as described above.

As further shown in FIG. 5, in some aspects, process 500 may include decoding LSB LLRs of the set of modulated symbols to obtain a first set of bits of the communication (block 520). For example, the receiver device (e.g., using antenna 234, DEMOD 232, MIMO detector 236, receive processor 238, controller/processor 240, antenna 252, DEMOD 254, MIMO detector 256, receive processor 258, controller/processor 280, and/or the like) may decode LSB LLRs of the set of modulated symbols to obtain a first set of bits of the communication, as described above.

As further shown in FIG. 5, in some aspects, process 500 may include performing a cyclic redundancy check on the first set of bits of the communication based at least in part on decoding the LSB LLRs of the set of modulated symbols to obtain the first set of bits (block 530). For example, the receiver device (e.g., using antenna 234, DEMOD 232, MIMO detector 236, receive processor 238, controller/processor 240, antenna 252, DEMOD 254, MIMO detector 256, receive processor 258, controller/processor 280, and/or the like) may perform a cyclic redundancy check on the first set of bits of the communication based at least in part on decoding the LSB LLRs of the set of modulated symbols to obtain the first set of bits, as described above.

As further shown in FIG. 5, in some aspects, process 500 may include decoding MSB LLRs of the set of modulated symbols to obtain a second set of bits of the communication based at least in part on a result of performing the cyclic redundancy check on the first set of bits (block 540). For example, the receiver device (e.g., using antenna 234, DEMOD 232, MIMO detector 236, receive processor 238, controller/processor 240, antenna 252, DEMOD 254, MIMO detector 256, receive processor 258, controller/processor 280, and/or the like) may decode MSB LLRs of the set of modulated symbols to obtain a second set of bits of the communication based at least in part on a result of performing the cyclic redundancy check on the first set of bits, as described above.

As further shown in FIG. 5, in some aspects, process 500 may include interpreting the communication based at least in part on decoding the MSB LLRs of the set of modulated symbols to obtain the second set of bits of the communication (block 550). For example, the receiver device (e.g., using antenna 234, DEMOD 232, MIMO detector 236, receive processor 238, controller/processor 240, antenna 252, DEMOD 254, MIMO detector 256, receive processor 258, controller/processor 280, and/or the like) may interpret the communication based at least in part on decoding the MSB LLRs of the set of modulated symbols to obtain the second set of bits of the communication, as described above.

Process 500 may include additional aspects, such as any single aspect or any combination of aspects described below and/or in connection with one or more other processes described elsewhere herein.

In a first aspect, decoding the LSB LLRs comprises: decoding the LSB LLRs based at least in part on computing the LLRs.

In a second aspect, alone or in combination with the first aspect, performing the cyclic redundancy check includes determining that the cyclic redundancy check is successful.

In a third aspect, alone or in combination with one or more of the first and second aspects, decoding the MSB LLRs includes adjusting the MSB LLRs based at least in part on the reencoded first set of bits, and decoding the adjusted MSB LLRs to obtain the second set of bits.

In a fourth aspect, alone or in combination with one or more of the first through third aspects, performing the cyclic redundancy check includes determining that the cyclic redundancy check is unsuccessful, and decoding the MSB LLRs comprises decoding the MSB LLRs without adjusting the MSB LLRs based at least in part on determining that the cyclic redundancy check is unsuccessful.

In a fifth aspect, alone or in combination with one or more of the first through fourth aspects, process 500 includes determining that code block or transport block decoding is successful independent of the cyclic redundancy check on the first set of bits.

In a sixth aspect, alone or in combination with one or more of the first through fifth aspects, process 500 includes determining that code block or transport block decoding is successful based at least in part on a result of the cyclic redundancy check on the first set of bits and a result of another cyclic redundancy check on the second set of bits, wherein a code block or transport is blocking of the communication does not have parity bits independent from parity bits of the first set of bits or the second set of bits.

Although FIG. 5 shows example blocks of process 500, in some aspects, process 500 may include additional blocks, fewer blocks, different blocks, or differently arranged blocks than those depicted in FIG. 5. Additionally, or alternatively, two or more of the blocks of process 500 may be performed in parallel.

Figure 6:
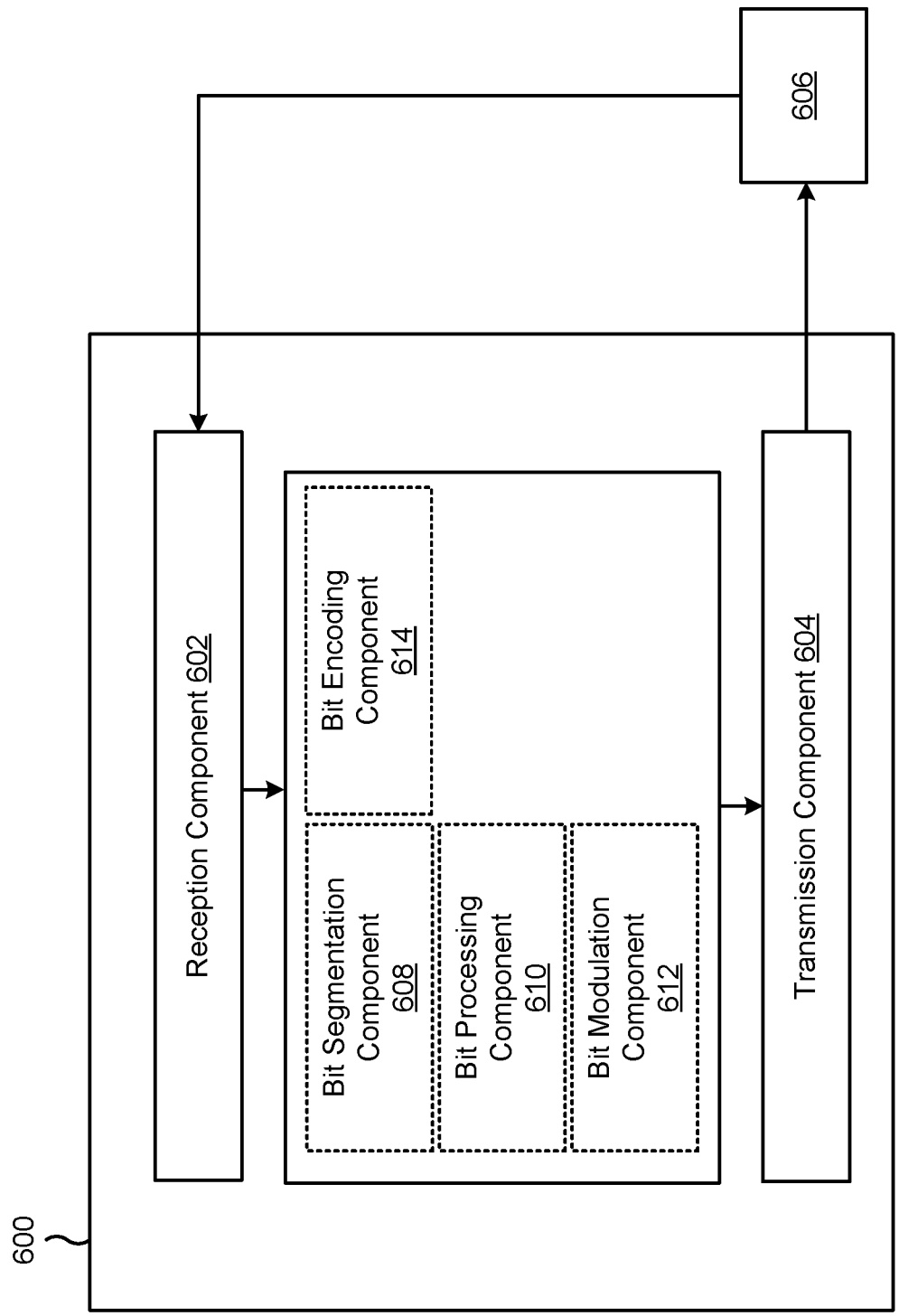
FIGS. 6-7 are block diagrams of example apparatuses for wireless communication, in accordance with the present disclosure.

FIG. 6 is a block diagram of an example apparatus 600 for wireless communication. The apparatus 600 may be a transmitter device, or a transmitter device may include the apparatus 600. In some aspects, the apparatus 600 includes a reception component 602 and a transmission component 604, which may be in communication with one another (for example, via one or more buses and/or one or more other components). As shown, the apparatus 600 may communicate with another apparatus 606 (such as a UE, a base station, or another wireless communication device) using the reception component 602 and the transmission component 604. As further shown, the apparatus 600 may include one or more of a bit segmentation component 608, a bit processing component 610, a bit modulation component 612, or a bit encoding component 614, among other examples.

In some aspects, the apparatus 600 may be configured to perform one or more operations described herein in connection with FIGS. 3A-3C. Additionally, or alternatively, the apparatus 600 may be configured to perform one or more processes described herein, such as process 400 of FIG. 4 or a combination thereof. In some aspects, the apparatus 600 and/or one or more components shown in FIG. 6 may include one or more components of the transmitter device described above in connection with FIG. 2. Additionally, or alternatively, one or more components shown in FIG. 6 may be implemented within one or more components described above in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 602 may receive communications, such as reference signals, control information, data communications, or a combination thereof, from the apparatus 606. The reception component 602 may provide received communications to one or more other components of the apparatus 600. In some aspects, the reception component 602 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 606. In some aspects, the reception component 602 may include one or more antennas, a demodulator, a MIMO detector, a receive processor, a controller/processor, a memory, or a combination thereof, of the transmitter device described above in connection with FIG. 2.

The transmission component 604 may transmit communications, such as reference signals, control information, data communications, or a combination thereof, to the apparatus 606. In some aspects, one or more other components of the apparatus 606 may generate communications and may provide the generated communications to the transmission component 604 for transmission to the apparatus 606. In some aspects, the transmission component 604 may perform signal processing on the generated communications (such as filtering, amplification, modulation, digital-to-analog conversion, multiplexing, interleaving, mapping, or encoding, among other examples), and may transmit the processed signals to the apparatus 606. In some aspects, the transmission component 604 may include one or more antennas, a modulator, a transmit MIMO processor, a transmit processor, a controller/processor, a memory, or a combination thereof, of the transmitter device described above in connection with FIG. 2. In some aspects, the transmission component 604 may be co-located with the reception component 602 in a transceiver.

The bit segmentation component 608 may segment a plurality of bits of a communication into a first set of bits and a second set of bits. The bit processing component 610 may process the first set of bits using a first processing chain and the second set of bits using a second processing chain, wherein the first set of bits is mapped to most significant bits (MSBs) of one or more symbols of a composite constellation and the second set of bits is mapped to least significant bits (LSBs) of the one or more symbols of the composite constellation, and wherein the composite constellation is formed from a plurality of lower order constellations. The bit modulation component 612 may modulate the first set of bits and the second set of bits to generate a set of modulated symbols. The transmission component 604 may transmit the set of modulated symbols.

The bit encoding component 614 may perform differential encoding on the set of modulated symbols, resource element mapping on the set of modulated symbols, and orthogonal frequency division multiplexing (OFDM) symbol generation on the set of modulated symbols.

The number and arrangement of components shown in FIG. 6 are provided as an example. In practice, there may be additional components, fewer components, different components, or differently arranged components than those shown in FIG. 6. Furthermore, two or more components shown in FIG. 6 may be implemented within a single component, or a single component shown in FIG. 6 may be implemented as multiple, distributed components. Additionally, or alternatively, a set of (one or more) components shown in FIG. 6 may perform one or more functions described as being performed by another set of components shown in FIG. 6.

Figure 7:
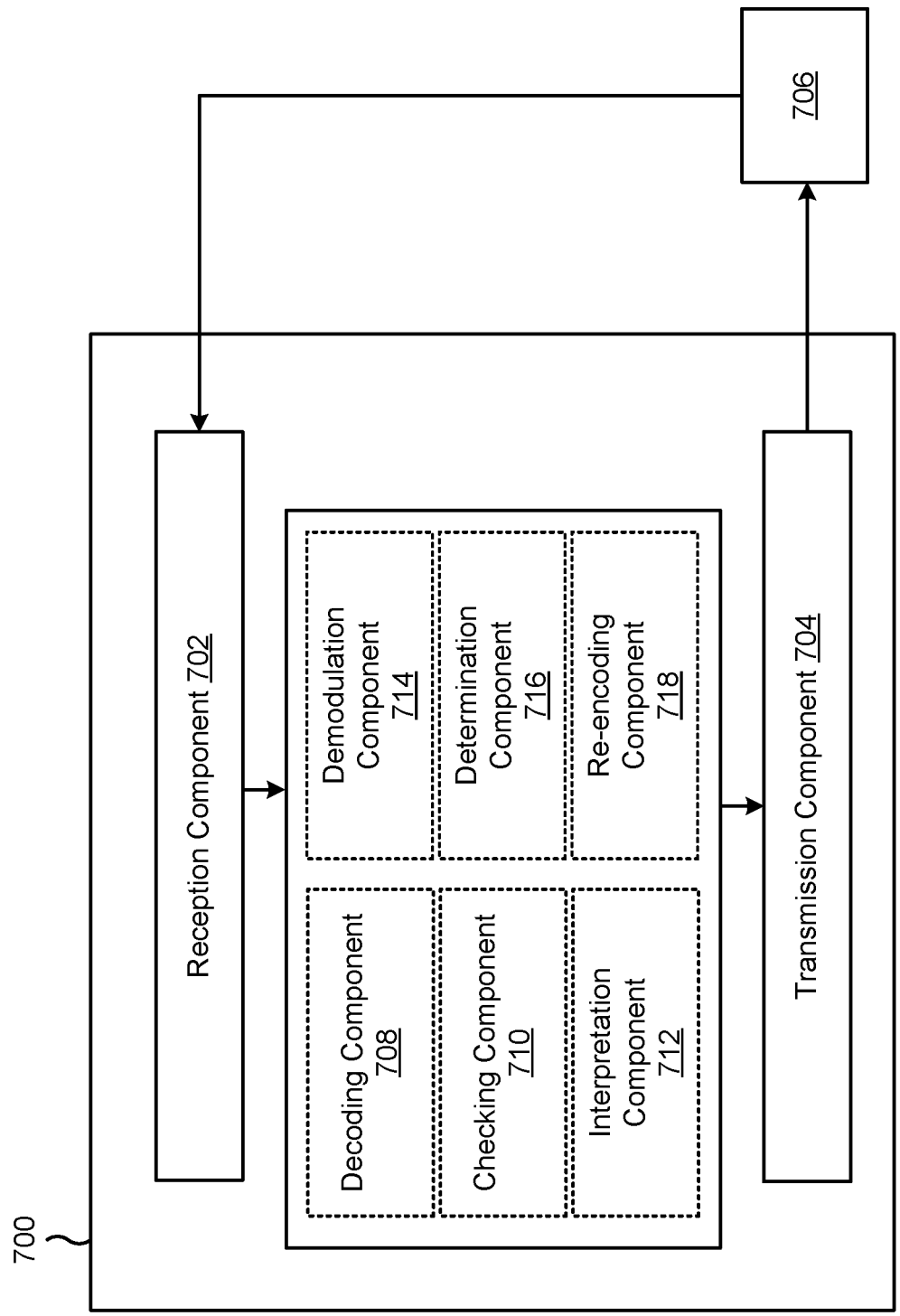

FIG. 7 is a block diagram of an example apparatus 700 for wireless communication. The apparatus 700 may be a receiver device, or a receiver device may include the apparatus 700. In some aspects, the apparatus 700 includes a reception component 702 and a transmission component 704, which may be in communication with one another (for example, via one or more buses and/or one or more other components). As shown, the apparatus 700 may communicate with another apparatus 706 (such as a UE, a base station, or another wireless communication device) using the reception component 702 and the transmission component 704. As further shown, the apparatus 700 may include one or more of a decoding component 708, a checking component 710, an interpretation component 712, a demodulation component 714, a determination component 716, or a re-encoding component 718, among other examples.

In some aspects, the apparatus 700 may be configured to perform one or more operations described herein in connection with FIGS. 3A-3C. Additionally, or alternatively, the apparatus 700 may be configured to perform one or more processes described herein, such as process 500 of FIG. 5. In some aspects, the apparatus 700 and/or one or more components shown in FIG. 7 may include one or more components of the receiver device described above in connection with FIG. 2. Additionally, or alternatively, one or more components shown in FIG. 7 may be implemented within one or more components described above in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 702 may receive communications, such as reference signals, control information, data communications, or a combination thereof, from the apparatus 706. The reception component 702 may provide received communications to one or more other components of the apparatus 700. In some aspects, the reception component 702 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 706. In some aspects, the reception component 702 may include one or more antennas, a demodulator, a MIMO detector, a receive processor, a controller/processor, a memory, or a combination thereof, of the receiver device described above in connection with FIG. 2.

The transmission component 704 may transmit communications, such as reference signals, control information, data communications, or a combination thereof, to the apparatus 706. In some aspects, one or more other components of the apparatus 706 may generate communications and may provide the generated communications to the transmission component 704 for transmission to the apparatus 706. In some aspects, the transmission component 704 may perform signal processing on the generated communications (such as filtering, amplification, modulation, digital-to-analog conversion, multiplexing, interleaving, mapping, or encoding, among other examples), and may transmit the processed signals to the apparatus 706. In some aspects, the transmission component 704 may include one or more antennas, a modulator, a transmit MIMO processor, a transmit processor, a controller/processor, a memory, or a combination thereof, of the receiver device described above in connection with FIG. 2. In some aspects, the transmission component 704 may be co-located with the reception component 702 in a transceiver.

The reception component 702 may receive a set of modulated symbols of a communication. The decoding component 708 may decode LSB log likelihood ratios (LLRs) of the set of modulated symbols to obtain a first set of bits of the communication. The checking component 710 may perform a cyclic redundancy check on the first set of bits of the communication based at least in part on decoding the LSB LLRs of the set of modulated symbols to obtain the first set of bits. The decoding component 708 may decode MSB LLRs of the set of modulated symbols to obtain a second set of bits of the communication based at least in part on a result of performing the cyclic redundancy check on the first set of bits. The interpretation component 712 may interpret the communication based at least in part on decoding the MSB LLRs of the set of modulated symbols to obtain the second set of bits of the communication.

The decoding component 708 may perform differential decoding on the set of modulated symbols of the communication.

The demodulation component 714 may demodulate the set of modulated symbols to compute LLRs from the set of modulated symbols based at least in part on performing differential decoding.

The determination component 716 may determine that code block or transport block decoding is successful independent of the cyclic redundancy check on the first set of bits.

The determination component 716 may determine that code block or transport block decoding is successful based at least in part on a result of the cyclic redundancy check on the first set of bits and a result of another cyclic redundancy check on the second set of bits wherein a code block or transport block of the communication does not have parity bits independent from parity bits of the first set of bits or the second set of bits.

The re-encoding component 718 may re-encode decoded bits of the first set of bits based at least in part on determining that a cyclic redundancy check is successful.

The number and arrangement of components shown in FIG. 7 are provided as an example. In practice, there may be additional components, fewer components, different components, or differently arranged components than those shown in FIG. 7. Furthermore, two or more components shown in FIG. 7 may be implemented within a single component, or a single component shown in FIG. 7 may be implemented as multiple, distributed components. Additionally, or alternatively, a set of (one or more) components shown in FIG. 7 may perform one or more functions described as being performed by another set of components shown in FIG. 7.

The following provides an overview of some Aspects of the present disclosure:

Aspect 1: A method of wireless communication performed by a transmitter device, comprising: segmenting a plurality of bits of a communication into a first set of bits and a second set of bits; processing the first set of bits using a first processing chain and the second set of bits using a second processing chain, wherein the first set of bits is mapped to most significant bits (MSBs) of one or more symbols of a composite constellation and the second set of bits is mapped to least significant bits (LSBs) of the one or more symbols of the composite constellation, and wherein the composite constellation is formed from a plurality of lower order constellations; modulating the first set of bits and the second set of bits to generate a set of modulated symbols; and transmitting the set of modulated symbols.

Aspect 2: The method of Aspect 1, wherein the composite constellation is a higher order phase shift keying (PSK) constellation formed by a plurality of lower order PSK constellations.

Aspect 3: The method of any of Aspects 1 to 2, wherein processing the first set of bits using the first processing chain and the second set of bits using the second processing chain includes encoding the first set of bits using a first coding scheme and the second set of bits using a second coding scheme.

Aspect 4: The method of any of Aspects 1 to 3, wherein processing the first set of bits using the first processing chain and the second set of bits using the second processing chain includes encoding the first set of bits using a first coding rate and the second set of bits using a second coding rate.

Aspect 5: The method of any of Aspects 1 to 4, wherein processing the first set of bits using the first processing chain and the second set of bits using the second processing chain includes rate matching the first set of bits and the second set of bits.

Aspect 6: The method of any of Aspects 1 to 5, wherein processing the first set of bits using the first processing chain and the second set of bits using the second processing chain includes adding parity bits to the second set of bits.

Aspect 7: The method of any of Aspects 1 to 6, wherein the parity bits of the second set of bits is different from parity bits, of the plurality of bits, associated with a code block or transport block of the communication.

Aspect 8: The method of any of Aspects 1 to 7, further comprising performing differential encoding on the set of modulated symbols, resource element mapping on the set of modulated symbols, and orthogonal frequency division multiplexing (OFDM) symbol generation on the set of modulated symbols, and wherein transmitting the set of modulated symbols includes transmitting the set of modulated symbols based at least in part on a result of the differential encoding, the resource element mapping, and the OFDM symbol generation.

Aspect 9: A method of wireless communication performed by a receiver device, comprising: receiving a set of modulated symbols of a communication; decoding least significant bit (LSB) log likelihood ratios (LLRs) of the set of modulated symbols to obtain a first set of bits of the communication; performing a cyclic redundancy check on the first set of bits of the communication based at least in part on decoding the LSB LLRs of the set of modulated symbols to obtain the first set of bits; decoding most significant bit (MSB) LLRs of the set of modulated symbols to obtain a second set of bits of the communication based at least in part on a result of performing the cyclic redundancy check on the first set of bits; and interpreting the communication based at least in part on decoding the MSB LLRs of the set of modulated symbols to obtain the second set of bits of the communication.

Aspect 10: The method of Aspect 9, further comprising performing differential decoding on the set of modulated symbols of the communication; demodulating the set of modulated symbols to compute LLRs from the set of modulated symbols based at least in part on performing differential decoding; and wherein decoding the LSB LLRs comprises decoding the LSB LLRs based at least in part on computing the LLRs.

Aspect 11: The method of any of Aspects 9 to 10, wherein performing the cyclic redundancy check includes determining that the cyclic redundancy check is successful.

Aspect 12: The method of any of Aspects 9 to 11, further comprising reencoding decoded bits of the first set of bits based at least in part on determining that the cyclic redundancy check is successful; and wherein decoding the MSB LLRs includes adjusting the MSB LLRs based at least in part on the reencoded first set of bits; and decoding the adjusted MSB LLRs to obtain the second set of bits.

Aspect 13: The method of any of Aspects 9 to 12, wherein performing the cyclic redundancy check includes determining that the cyclic redundancy check is unsuccessful; and wherein decoding the MSB LLRs includes decoding the MSB LLRs without adjusting the MSB LLRs based at least in part on determining that the cyclic redundancy check is unsuccessful.

Aspect 14: The method of any of Aspects 9 to 13, further comprising determining that code block or transport block decoding is successful independent of the cyclic redundancy check on the first set of bits.

Aspect 15: The method of any of Aspects 9 to 14, further comprising determining that code block or transport block decoding is successful based at least in part on a result of the cyclic redundancy check on the first set of bits and a result of another cyclic redundancy check on the second set of bits, wherein a code block or transport block of the communication does not have parity bits independent from parity bits of the first set of bits or the second set of bits.

Aspect 16: An apparatus for wireless communication at a device, comprising a processor; memory coupled with the processor; and instructions stored in the memory and executable by the processor to cause the apparatus to perform the method of one or more Aspects of Aspects 1-8.

Aspect 17: A device for wireless communication, comprising a memory and one or more processors coupled to the memory, the memory and the one or more processors configured to perform the method of one or more Aspects of Aspects 1-8.

Aspect 18: An apparatus for wireless communication, comprising at least one means for performing the method of one or more Aspects of Aspects 1-8.

Aspect 19: A non-transitory computer-readable medium storing code for wireless communication, the code comprising instructions executable by a processor to perform the method of one or more Aspects of Aspects 1-8.

Aspect 20: A non-transitory computer-readable medium storing a set of instructions for wireless communication, the set of instructions comprising one or more instructions that, when executed by one or more processors of a device, cause the device to perform the method of one or more Aspects of Aspects 1-8.

Aspect 21: An apparatus for wireless communication at a device, comprising a processor; memory coupled with the processor; and instructions stored in the memory and executable by the processor to cause the apparatus to perform the method of one or more Aspects of Aspects 9-15.

Aspect 22: A device for wireless communication, comprising a memory and one or more processors coupled to the memory, the memory and the one or more processors configured to perform the method of one or more Aspects of Aspects 9-15.

Aspect 23: An apparatus for wireless communication, comprising at least one means for performing the method of one or more Aspects of Aspects 9-15.

Aspect 24: A non-transitory computer-readable medium storing code for wireless communication, the code comprising instructions executable by a processor to perform the method of one or more Aspects of Aspects 9-15.

Aspect 25: A non-transitory computer-readable medium storing a set of instructions for wireless communication, the set of instructions comprising one or more instructions that, when executed by one or more processors of a device, cause the device to perform the method of one or more Aspects of Aspects 9-15.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a processor is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method of wireless communication performed by a transmitter device, comprising:
  segmenting a plurality of bits of a communication into a first set of bits and a second set of bits;
  processing the first set of bits using a first processing chain and the second set of bits using a second processing chain, wherein the first set of bits is mapped to most significant bits (MSBs) of one or more symbols of a composite constellation and the second set of bits is mapped to least significant bits (LSBs) of the one or more symbols of the composite constellation, and wherein the composite constellation is formed from a plurality of lower order constellations;
  modulating the first set of bits and the second set of bits to generate a set of modulated symbols; and
  transmitting the set of modulated symbols.

2. The method of claim 1, wherein the composite constellation is a higher order phase shift keying (PSK) constellation formed by a plurality of lower order PSK constellations.

3. The method of claim 1, wherein processing the first set of bits using the first processing chain and the second set of bits using the second processing chain comprises:
encoding the first set of bits using a first coding scheme and the second set of bits using a second coding scheme.

4. The method of claim 1, wherein processing the first set of bits using the first processing chain and the second set of bits using the second processing chain comprises:
encoding the first set of bits using a first coding rate and the second set of bits using a second coding rate.

5. The method of claim 1, wherein processing the first set of bits using the first processing chain and the second set of bits using the second processing chain comprises:
rate matching the first set of bits and the second set of bits.

6. The method of claim 1, wherein processing the first set of bits using the first processing chain and the second set of bits using the second processing chain comprises:
adding parity bits to the second set of bits.

7. The method of claim 6, wherein the parity bits of the second set of bits are different from parity bits, of the plurality of bits, associated with a code block or transport block of the communication.

8. The method of claim 1, further comprising:
performing differential encoding on the set of modulated symbols, resource element mapping on the set of modulated symbols, and orthogonal frequency division multiplexing (OFDM) symbol generation on the set of modulated symbols; and
wherein transmitting the set of modulated symbols comprises:
transmitting the set of modulated symbols based at least in part on a result of the differential encoding, the resource element mapping, and the OFDM symbol generation.

9. A transmitter device for wireless communication, comprising:
a memory; and
one or more processors, coupled to the memory, configured to:
segment a plurality of bits of a communication into a first set of bits and a second set of bits;
process the first set of bits using a first processing chain and the second set of bits using a second processing chain, wherein the first set of bits is mapped to most significant bits (MSBs) of one or more symbols of a composite constellation and the second set of bits is mapped to least significant bits (LSBs) of the one or more symbols of the composite constellation, and wherein the composite constellation is formed from a plurality of lower order constellations;
modulate the first set of bits and the second set of bits to generate a set of modulated symbols; and
transmit the set of modulated symbols.

10. The transmitter device of claim 9, wherein the composite constellation is a higher order phase shift keying (PSK) constellation formed by a plurality of lower order PSK constellations.

11. The transmitter device of claim 9, wherein the one or more processors, to process the first set of bits using the first processing chain and the second set of bits using the second processing chain, are configured to:
encode the first set of bits using a first coding scheme and the second set of bits using a second coding scheme.

12. The transmitter device of claim 9, wherein the one or more processors, to process the first set of bits using the first processing chain and the second set of bits using the second processing chain, are configured to:
encode the first set of bits using a first coding rate and the second set of bits using a second coding rate.

13. The transmitter device of claim 9, wherein the one or more processors, to process the first set of bits using the first processing chain and the second set of bits using the second processing chain, are configured to:
rate match the first set of bits and the second set of bits.

14. The transmitter device of claim 9, wherein the one or more processors, to process the first set of bits using the first processing chain and the second set of bits using the second processing chain, are configured to:
add parity bits to the second set of bits.

15. The transmitter device of claim 14, wherein the parity bits of the second set of bits is different from parity bits, of the plurality of bits, associated with a code block or transport block of the communication.

16. The transmitter device of claim 9, wherein the one or more processors are further configured to:
perform differential encoding on the set of modulated symbols, resource element mapping on the set of modulated symbols, and orthogonal frequency division multiplexing (OFDM) symbol generation on the set of modulated symbols; and
wherein the one or more processors, to transmit the set of modulated symbols, are configured to:
transmit the set of modulated symbols based at least in part on a result of the differential encoding, the resource element mapping, and the OFDM symbol generation.

17. A non-transitory computer-readable medium storing a set of instructions for wireless communication, the set of instructions comprising:
one or more instructions that, when executed by one or more processors of a transmitter device, cause the transmitter device to:
segment a plurality of bits of a communication into a first set of bits and a second set of bits;
process the first set of bits using a first processing chain and the second set of bits using a second processing chain, wherein the first set of bits is mapped to most significant bits (MSBs) of one or more symbols of a composite constellation and the second set of bits is mapped to least significant bits (LSBs) of the one or more symbols of the composite constellation, and wherein the composite constellation is formed from a plurality of lower order constellations;
modulate the first set of bits and the second set of bits to generate a set of modulated symbols; and
transmit the set of modulated symbols.

18. The non-transitory computer-readable medium of claim 17, wherein the composite constellation is a higher order phase shift keying (PSK) constellation formed by a plurality of lower order PSK constellations.

19. The non-transitory computer-readable medium of claim 17, wherein the one or more instructions, that cause the transmitter device to process the first set of bits using the first processing chain and the second set of bits using the second processing chain, cause the transmitter device to:
encode the first set of bits using a first coding scheme and the second set of bits using a second coding scheme.

20. The non-transitory computer-readable medium of claim 17, wherein the one or more instructions, that cause the transmitter device to process the first set of bits using the first processing chain and the second set of bits using the second processing chain, cause the transmitter device to:
    encode the first set of bits using a first coding rate and the second set of bits using a second coding rate.

21. The non-transitory computer-readable medium of claim 17, wherein the one or more instructions, that cause the transmitter device to process the first set of bits using the first processing chain and the second set of bits using the second processing chain, cause the transmitter device to:
    rate matching the first set of bits and the second set of bits.

22. The non-transitory computer-readable medium of claim 17, wherein the one or more instructions, that cause the transmitter device to process the first set of bits using the first processing chain and the second set of bits using the second processing chain, cause the transmitter device to:
    add parity bits to the second set of bits.

23. The non-transitory computer-readable medium of claim 22, wherein the parity bits of the second set of bits are different from parity bits, of the plurality of bits, associated with a code block or transport block of the communication.

24. The non-transitory computer-readable medium of claim 17, wherein the one or more instructions further cause the transmitter device to:
    perform differential encoding on the set of modulated symbols, resource element mapping on the set of modulated symbols, and orthogonal frequency division multiplexing (OFDM) symbol generation on the set of modulated symbols; and
    wherein the one or more instructions, that cause the transmitter device to transmit the set of modulated symbols, cause the transmitter device to:
        transmit the set of modulated symbols based at least in part on a result of the differential encoding, the resource element mapping, and the OFDM symbol generation.

25. An apparatus for wireless communication, comprising:
    means for segmenting a plurality of bits of a communication into a first set of bits and a second set of bits;
    means for processing the first set of bits using a first processing chain and the second set of bits using a second processing chain, wherein the first set of bits is mapped to most significant bits (MSBs) of one or more symbols of a composite constellation and the second set of bits is mapped to least significant bits (LSBs) of the one or more symbols of the composite constellation, and wherein the composite constellation is formed from a plurality of lower order constellations;
    means for modulating the first set of bits and the second set of bits to generate a set of modulated symbols; and
    means for transmitting the set of modulated symbols.

26. The apparatus of claim 25, wherein the composite constellation is a higher order phase shift keying (PSK) constellation formed by a plurality of lower order PSK constellations.

27. The apparatus of claim 25, wherein the means for processing the first set of bits using the first processing chain and the second set of bits using the second processing chain comprises:
    means for encoding the first set of bits using a first coding scheme and the second set of bits using a second coding scheme.

28. The apparatus of claim 25, wherein the means for processing the first set of bits using the first processing chain and the second set of bits using the second processing chain comprises:
    means for encoding the first set of bits using a first coding rate and the second set of bits using a second coding rate.

29. The apparatus of claim 25, further comprising:
    means for performing differential encoding on the set of modulated symbols, resource element mapping on the set of modulated symbols, and orthogonal frequency division multiplexing (OFDM) symbol generation on the set of modulated symbols; and
    wherein the means for transmitting the set of modulated symbols comprises:
    means for transmitting the set of modulated symbols based at least in part on a result of the differential encoding, the resource element mapping, and the OFDM symbol generation.

* * * * *